United States Patent
Hirano et al.

(10) Patent No.: US 6,271,690 B1
(45) Date of Patent: Aug. 7, 2001

(54) DISCRIMINATOR

(75) Inventors: Jun Hirano, Yokosuka; Susumu Morikura, Yawata; Satoshi Furusawa, Osaka, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/534,873

(22) Filed: Mar. 24, 2000

(30) Foreign Application Priority Data

Mar. 26, 1999 (JP) .................................................. 11-083311

(51) Int. Cl.[7] .................................................. H03K 5/153
(52) U.S. Cl. .................................................. 327/75; 327/74
(58) Field of Search .................................................. 327/74, 75, 76, 327/68, 62, 72, 73, 71

(56) References Cited

U.S. PATENT DOCUMENTS 5,703,505 * 12/1997 Kwon ..................................... 327/75
5,856,751 * 1/1999 Gleim et al. ............................ 327/74
6,137,306 * 10/2000 Hirata et al. ............................ 327/74

FOREIGN PATENT DOCUMENTS 6-310967 11/1994 (JP) .
10-209825 8/1998 (JP) .

* cited by examiner

Primary Examiner—Toan Tran
(74) Attorney, Agent, or Firm—Wenderoth, Lind & Ponack, L.L.P.

(57) ABSTRACT

A discriminator capable of generating a multi-level signal with less restrictions is provided. In a discriminator D1, a wave-shaping circuit 3 shapes the waveform of one branched multi-level signal MS, according to a control signal CS from a control signal generator 10 so that a detector 4 that follows the wave-shaping circuit 3 can correctly detect a first reference level $RL_1$. The detector 4 detects the first reference level $RL_1$ from an output signal $OS_3$ from the wave-shaping circuit 3. A reference level generator 5 generates a second reference level $RL_2$ of the multi-level signal MS. A threshold generator 6 generates thresholds $Th_1$, $Th_2$, and $Th_3$ as much as required according to the first and second reference levels $RL_1$ and $RL_2$. Comparators 82 to 84 compares the amplitude of the other branched multi-level signal MS with the thresholds $Th_1$, $Th_2$, and $Th_3$. A control signal generator 10 generates a control signal CS according to the comparison results from the comparators 82 to 84. The above structured discriminator D1 enables the transmitting side to generate a multi-level signal with less restrictions.

13 Claims, 10 Drawing Sheets

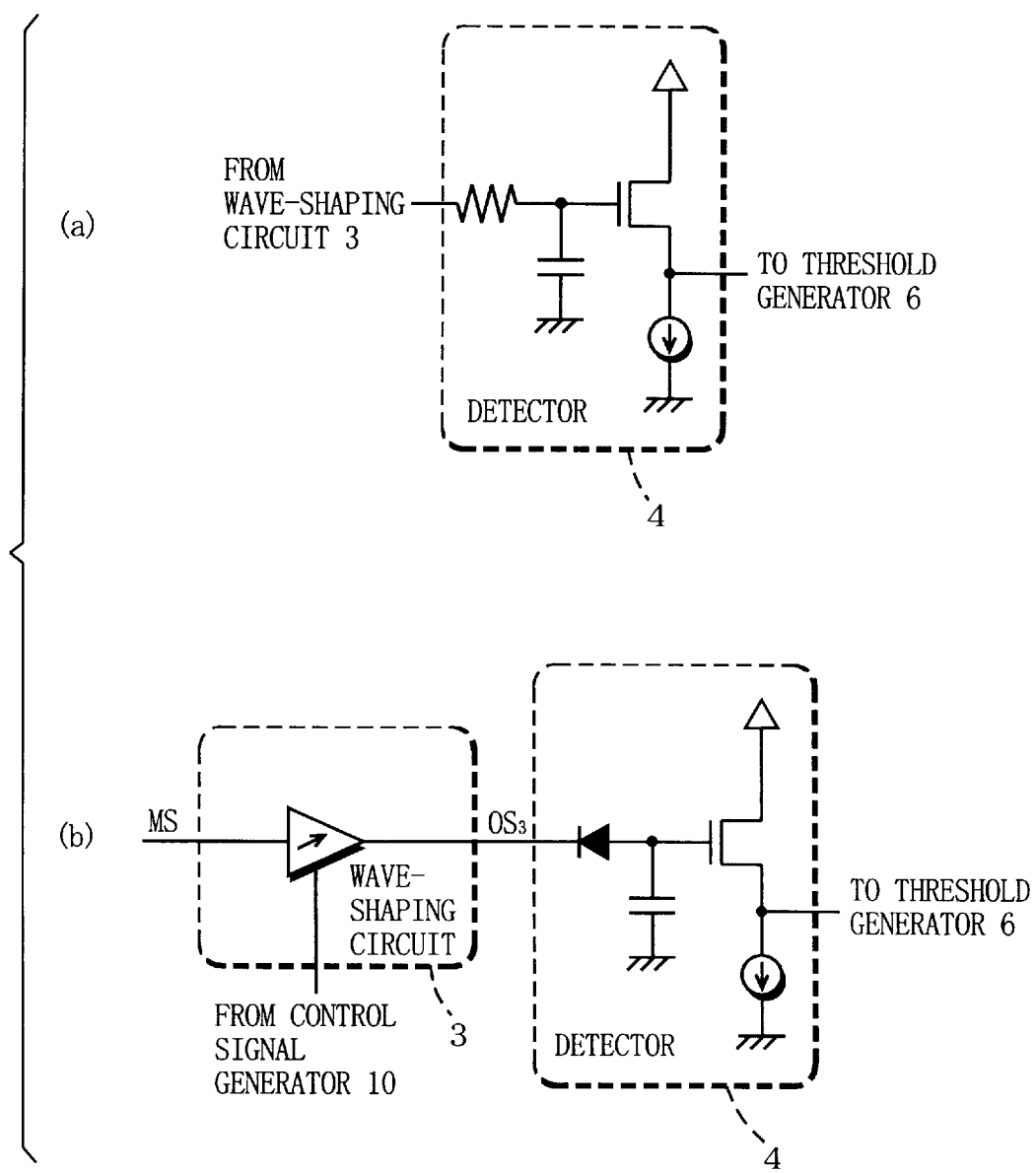
F I G. 4

| SIGNAL | ONE LINE | THE OTHER LINE | DEFINITION |
|---|---|---|---|
| $CS_1$ | "Hi" | "Hi" | AMPLITUDE VALUES "X" "Y" EXCESSIVELY DISTRIBUTED |
| $CS_2$ | "Lo" | "Lo" | AMPLITUDE VALUES "X" "Y" NOT EXCESSIVELY DISTRIBUTED |
| $CS_3$ | "Hi" | "Lo" | AMPLITUDE VALUE "X" EXCESSIVELY DISTRIBUTED |
| $CS_4$ | "Lo" | "Hi" | AMPLITUDE VALUE "Y" EXCESSIVELY DISTRIBUTED |

DISCRIMINATOR

BACKGROUND OF THE INVENTION

1. Field of the Invention

The present invention relates to discriminators and, more specifically, to a discriminator automatically generating optimum thresholds and discriminating the amplitude of an input multi-level signal with the generated thresholds.

2. Description of the Background Art

Conventionally, a multi-level signal varying in amplitude among three or more values can be sent and received in a transmission system. In such multi-level signal, information is assigned to each amplitude value. The receiving side in the transmission system discriminates the amplitude of the received multi-level signal using predetermined thresholds. However, with fluctuations in amplitude of the multi-level signal due to various factors, fixed thresholds are not preferable because each of the thresholds may be shifted from a mid-level between one amplitude value and the amplitude value just one level below or above. As a result, the receiving side may perform erroneous amplitude discrimination, or the resultant pulse width after discrimination may be distorted.

Furthermore, in a transmission system of a binary signal indicative of "Hi" or "Lo", the receiving side may perform amplitude discrimination with a discriminator CD as shown in FIG. 12. In FIG. 12, the discriminator CD is adapted to automatically generate a threshold that is appropriate for amplitude discrimination (so-called automatic threshold control) even if the amplitude of the received binary signal may fluctuate. The discriminator CD includes an input terminal 21, a branching part 22, a peak detector 23, a base level generator 24, a threshold generator 25, and a comparator 26.

The branching part 22 branches a binary signal fed through the input terminal 21 into two, outputting one to the peak detector 23 and the other to the comparator 26. The peak detector 23 detects and holds a peak value of the received binary signal. The detected peak value is equal in electric potential to "Hi" of the binary signal which may fluctuate, and fed to the threshold generator 25. The base level generator 24 generates a base level equal in electric potential to "Lo" of the binary signal, and outputs the base level to the threshold generator 25. The threshold generator 25 generates a threshold having a mid-level between the received peak level and base level, and outputs the threshold to the comparator 26. The comparator 26 compares the amplitude of the branched binary signal with the threshold, and outputs the comparison result. As such, the peak detector 23 detects the peak value of the binary signal, enabling the threshold generator 25 to automatically generate the threshold even with fluctuations in amplitude of the binary signal.

For applying the above discriminator CD to multi-level signal transmission systems, the threshold generator 25, which generates the mid-level value, is modified to generate a plurality of thresholds each having a mid-level between one amplitude value and the amplitude value just one level below or above of a multi-level signal.

In general, a marking ratio of appearing each amplitude value of a multi-level signal is lower than that of a binary signal. Therefore, the maximum amplitude value of the multi-level signal does not necessarily appear during an interval defined by a time constant of the peak detector 23. In such case, the peak value detected by the peak detector 23 does not become equal in electric potential to the maximum amplitude value of the multi-level signal. As a result, the threshold generator 25 cannot generate accurate thresholds.

Furthermore, the marking ratio in the multi-level signal is difficult to manage compared with that in the binary signal. In addition, the mean value of the multi-level signal does not necessarily indicate the mid-level of the amplitude. Therefore, replacing the peak detector 23 with a mean value detector is not practical.

Due to the above background, in conventional multi-level signal transmission systems, the transmitting side is required to transmit at least a maximum amplitude value of the multi-level signal (and a minimum amplitude value thereof as required) to the receiving side every predetermined time to charge a capacitance of the peak detector 23. Or, the transmitting side is required to produce a multi-level signal in which at least its maximum amplitude value (and also minimum amplitude value, in some cases) moderately appears. Therefore, when the conventional discriminator CD is applied to a multi-level signal transmission system, the transmitting side is disadvantageously under restrictions on generating a multi-level signal.

SUMMARY OF THE INVENTION

Therefore, an object of the present invention is to provide a discriminator enabling a transmitting side to generate a multi-level signal with less restrictions.

The present invention has the following aspects to achieve the above object. Further, each aspect has technical effects as described below.

A first aspect of the present invention is directed to a discriminator discriminating a multi-level signal varying in amplitude among three or more values, comprising: a first branching part branching the multi-level signal externally inputted thereto into two; a wave-shaping circuit shaping a waveform of the multi-level signal branched by the first branching part under a predetermined condition; a detector detecting a first reference level based on an output signal from the wave-shaping circuit; a reference level generator generating a second reference level of the multi-level signal externally inputted; a threshold generator generating a required number of thresholds according to the first and second reference levels; a comparing circuit comparing the amplitude of the multi-level signal branched by the first branching part with the thresholds generated by the threshold generator; and a control signal generator generating a control signal according to a comparison result by the comparing circuit, the wave-shaping circuit shaping the waveform of the multi-level signal inputted thereto according to the control signal outputted from the control signal generator so that the detector can correctly detect the first reference level.

According to a second aspect, in the first aspect, the threshold generator generates (the number of amplitude values–1) different thresholds according to the first and second reference levels, the comparing circuit comprises: a second branching part branching the multi-level signal inputted thereto into (the number of amplitude values–1); and (the number of amplitude values–1) comparators each receiving different one of the thresholds generated by the threshold generator and the multi-level signal branched by the second branching part, and each of the comparators compares the amplitude of the received multi-level signal with the received threshold.

In the first and second aspects, even when the discriminator is provided with a multi-level signal in which one or more specific amplitude values are excessively distributed during a time interval, the wave-shaping circuit can perform wave-shaping according to the control signal. Therefore, the comparing circuit can discriminate the amplitude of the multi-level signal using correct thresholds. This amplitude discrimination enables generation of the multi-level signal in the transmitting side with less restrictions.

According to a third aspect, in the first aspect, the discriminator further comprises an amplitude adjuster adjusting a relative difference between the amplitude of the multi-level signal branched by the first branching part and each of the thresholds generated by the threshold generator.

In the third aspect, the amplitude adjuster adjusts the relative difference between the amplitude of the multi-level signal and the thresholds. The threshold generator can thus generate more appropriate thresholds, thereby greatly reducing the possibility of generating erroneous discrimination results and further avoiding pulse-width distortion in the discrimination results.

According to a fourth aspect, in the first aspect, the reference level generator generates the second reference level having an electric potential when the multi-level signal is not sent.

In the fourth aspect, the second reference level can be easily generated.

According to a fifth aspect, in the first aspect, the control signal defines a time interval during which one or more predetermined amplitude values are excessively distributed in the multi-level signal, and the wave-shaping circuit shapes the waveform of the multi-level signal inputted thereto so that one of the predetermined amplitude values becomes equal to the second reference level during the time interval defined by the control signal.

In the fifth aspect, the control signal generator generates a control signal that defines a time interval during which one or more predetermined amplitude values are excessively distributed in the multi-level signal, according to the comparison result from the comparing circuit, and feeds-back the control signal to the wave-shaping circuit. Therefore, the wave-shaping circuit can appropriately shapes the waveform of the multi-level signal currently being received by the discriminator.

A sixth aspect is directed to a discriminator discriminating a multi-level signal varying in amplitude among three or more values, comprising: a first branching part branching the multi-level signal externally inputted thereto into three and outputting first to third multi-level signals; a first wave-shaping circuit shaping a waveform of the first multi-level signal outputted from the first branching part under a predetermined condition; a first detector detecting a first reference level from an output signal from the first wave-shaping circuit; a second wave-shaping circuit shaping a waveform of the second multi-level signal outputted from the first branching part under a predetermined condition; a second detector detecting a second reference level from a signal outputted from the second wave-shaping circuit; a threshold generator generating a required number of thresholds according to the first and second reference levels; a comparing circuit comparing the amplitude of the third multi-level signal outputted from the first branching part with the thresholds generated by the threshold generator; and a control signal generator generating a control signal according to a comparison result by the comparing circuit, the first wave-shaping circuit shaping the waveform of the first multi-level signal inputted thereto according to the control signal outputted from the control signal generator so that the first detector can correctly detect the first reference level, and the second wave-shaping circuit shaping the waveform of the second multi-level signal inputted thereto according to the control signal outputted from the control signal generator so that the second detector can correctly detect the second reference level.

According to a seventh aspect, in the sixth aspect, the threshold generator generates (the number of amplitude values–1) different thresholds according to the first and second reference levels, the comparing circuit comprises: a second branching part branching the third multi-level signal inputted thereto into (the number of amplitude values–1); and (the number of amplitude values–1) comparators each receiving different one of the thresholds generated by the threshold generator and the third multi-level signal branched by the second branching part, and each of the comparators compares the amplitude of the received third multi-level signal with the received threshold.

In the sixth and seventh aspects, even when the discriminator receives a multi-level signal in which one or more specific amplitude values are excessively distributed during a time interval, the first and second wave-shaping circuits can perform wave-shaping according to the control signal. Therefore, the comparing circuit can discriminate the amplitude of the multi-level signal using correct thresholds. This amplitude discrimination enables generation of the multi-level signal in the transmitting side with less restrictions.

According to an eighth aspect, in the sixth aspect, the discriminator further comprises an amplitude adjuster adjusting a relative difference between the amplitude of the third multi-level signal inputted to the comparing circuit and each of the thresholds generated by the threshold generator.

According to a ninth aspect, in the sixth aspect, the control signal defines a time interval during which one or more predetermined amplitude values are excessively distributed in the multi-level signal, and the first and second wave-shaping circuits shape the waveforms of the first and second multi-level signals inputted thereto so that one of the predetermined amplitude value becomes equal to the first and second reference levels, respectively, during the time interval defined by the control signal.

A tenth aspect is directed to a discriminator discriminating a multi-level signal varying in amplitude among three or more values, comprising: a first branching part branching the multi-level signal externally inputted thereto into two; a first wave-shaping circuit shaping a waveform of the multi-level signal outputted from the first branching part under a predetermined condition; a second wave-shaping circuit shaping a waveform of an output signal from the first wave-shaping circuit under a predetermined condition; a first detector detecting a first reference level based on an output signal from the second wave-shaping circuit; a second detector detecting a second reference level based on the output signal from the second wave-shaping circuit; a threshold generator generating a required number of thresholds according to the first and second reference levels, a comparing circuit comparing the amplitude level of the multi-level signal branched by the first branching part with the thresholds generated by the threshold generator; and a control signal generator generating a control signal according to a comparison result by the comparing circuit, the first wave-shaping circuit shaping the waveform of the multi-level signal inputted thereto according to the control signal outputted from the control signal generator so that the first detector can correctly detect the first reference level, and the second wave-shaping circuit shaping the waveform of the output signal from the first wave-shaping circuit according to the control signal outputted from the control signal generator so that the second detector can correctly detect the second reference level.

According to an eleventh aspect, in the tenth aspect, the threshold generator generates (the number of amplitude values–1) different thresholds according to the first and second reference levels, the comparing circuit comprises: a second branching part branching the multi-level signal inputted thereto into (the number of amplitude values–1); and (the number of amplitude values–1) comparators each receiving different one of the thresholds generated by the threshold generator and the multi-level signal branched by the second branching part, and each of the comparators compares the amplitude of the received multi-level signal with the received threshold.

In the tenth and eleventh aspects, even when the discriminator receives a multi-level signal in which one or more specific amplitude values are excessively distributed during a time interval, the first and second wave-shaping circuits can perform wave-shaping according to the control signal. Therefore, the comparing circuit can discriminate the amplitude of the multi-level signal using correct thresholds. This amplitude discrimination enables generation of the multi-level signal in the transmitting side with less restrictions.

According to a twelfth aspect, in the tenth aspect, the discriminator further comprises an amplitude adjuster adjusting a relative difference between the amplitude of the multi-level signal branched by the first branching part and the thresholds generated in the threshold generator.

According to a thirteenth aspect, in the tenth aspect, the control signal defines a time interval during which one or more predetermined amplitude values are excessively distributed in the multi-level signal, and the first and second wave-shaping circuits shape the waveform of respective received signal so that one of the predetermined amplitude values become equal to the first and second reference levels, respectively, during the time interval defined by the control signal.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4a is a circuit diagram showing another structure of a detector 4;

FIG. 4b is a circuit diagram showing another structure of the detector 4 and a wave-shaping circuit 3;

FIG. 9a is a diagram showing a value of the second reference level $RL_2$ according to the second embodiment;

FIG. 9b is a diagram showing values of the thresholds $Th_1$, $Th_2$, and $Th_3$ according to the second embodiment;

DESCRIPTION OF THE PREFERRED EMBODIMENTS

Figure 1:
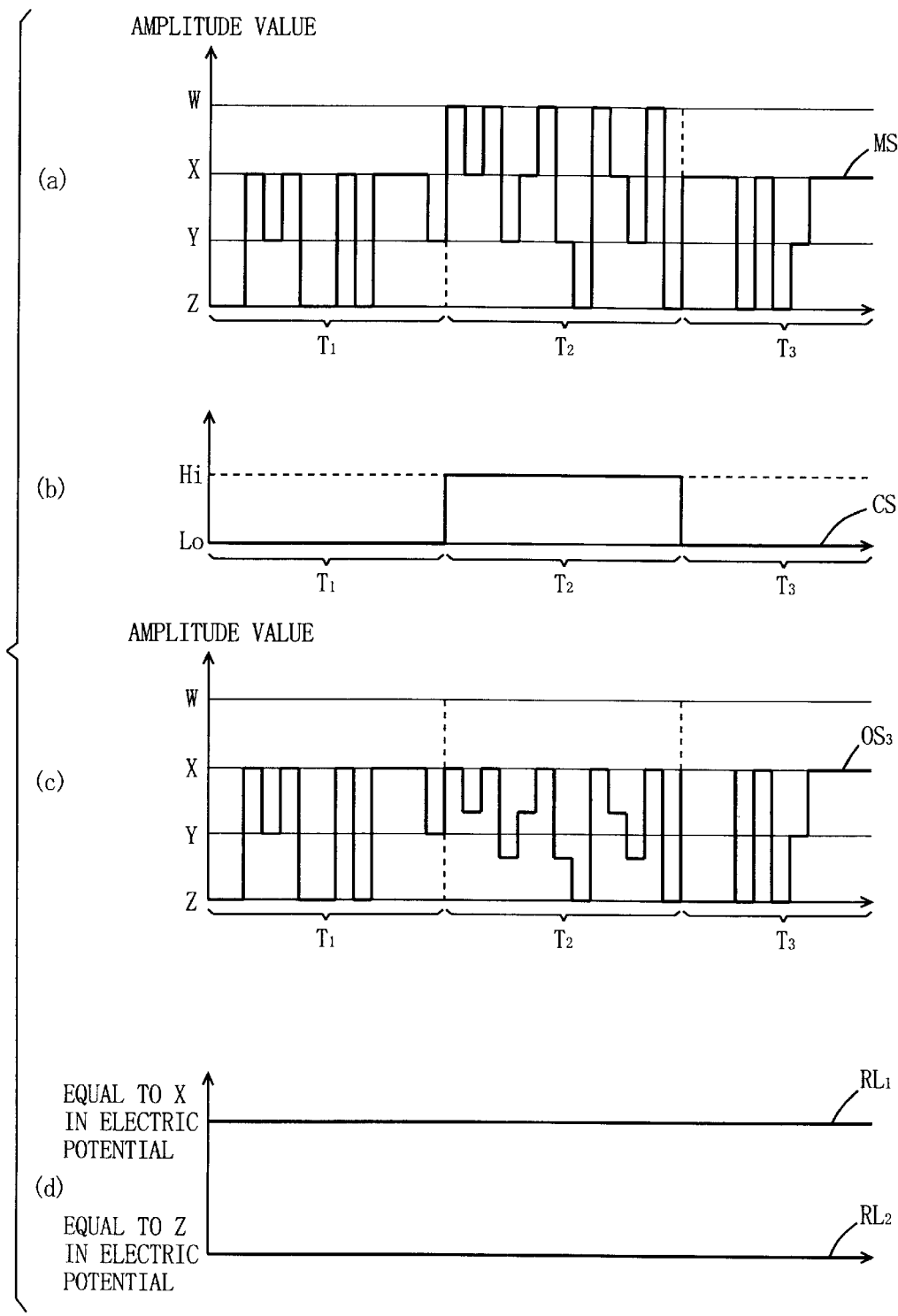
FIG. 1a is a diagram showing the waveform of a multi-level signal MS.
FIG. 1b is a diagram showing the waveform of a control signal CS.
FIG. 1c is a diagram showing the waveform of an output signal $OS_3$.
FIG. 1d is a diagram showing values of a first reference level $RL_1$ and a second reference level $RL_2$.

With reference to FIG. 1a, described first is a multi-level signal MS to be inputted to a discriminator D1 according to a first embodiment of the present invention. The multi-level signal MS is a signal in which each symbol is represented by any one of n amplitude values (n is a natural number not less than 3). In FIG. 1a, a case where n=4 is exemplarily shown. Here, by way of explanation only, assume that the multi-level signal MS is represented by amplitude values "W", "X", "Y", and "Z" (W>X>Y>Z). Further, assume that $|W-X|=|X-Y|=|Y-Z|=\Delta V$.

The multi-level signal MS is generated at a transmitting side in a transmission system. The multi-level signal MS does not have to be a signal with moderately-mixed amplitude values, but may be a signal with one or more specific amplitude values excessively distributed. In the multi-level signal MS of FIG. 1a, the amplitude value "W" is not present in time intervals $T_1$ and $T_3$, but is excessively distributed in a time interval $T_2$.

The transmitting side transmits this multi-level signal MS as an electric signal to a receiving side through a transmission path, or converts the multi-level signal MS into an optical signal and then transmits to the receiving side.

Figure 2:
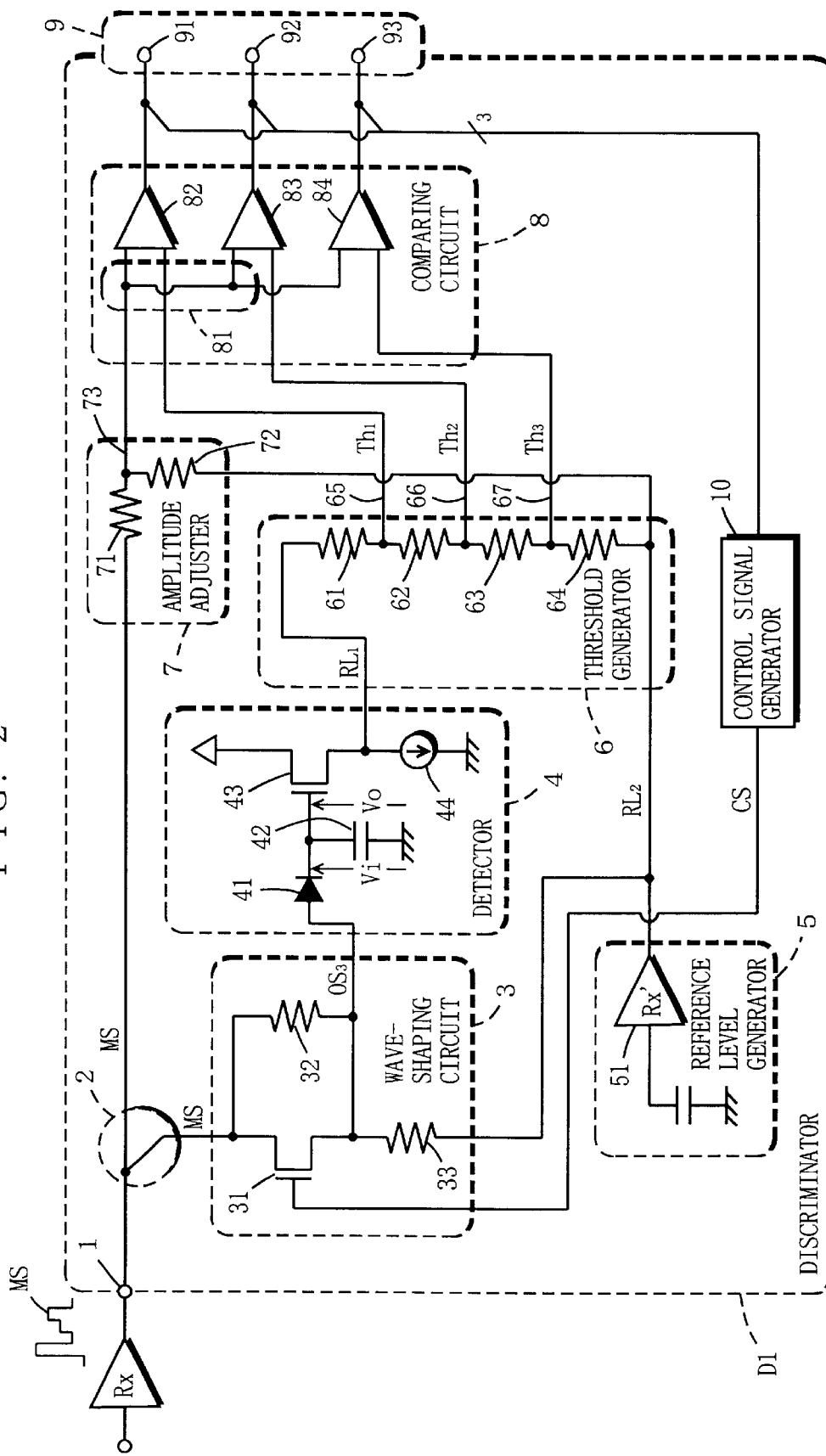
FIG. 2 is a circuit diagram showing the entire configuration of a discriminator D1 according to a first embodiment.

FIG. 2 shows a schematic configuration of the receiving side in an optical transmission system. In FIG. 2, the receiving side includes an optical receiver Rx and a discriminator D1. The optical receiver Rx receives the optical signal through an optical transmission path (not shown), converts it to the multi-level signal MS, and then outputs the multi-level signal MS to the discriminator D1. Note that the optical receiver Rx is not required when the transmitting side sends the electric multi-level signal MS, and the discriminator D1 is directly provided with the multi-level signal MS.

The discriminator D1 includes an input terminal 1, a first branching part 2, a wave-shaping circuit 3, a detector 4, a reference level generator 5, a threshold generator 6, an amplitude adjuster 7, a comparing circuit 8, an output terminal group 9, and a control signal generator 10.

The input terminal 1 is provided with the multi-level signal MS from the optical receiver Rx or transmitted through the transmission path.

The first branching part 2 branches the multi-level signal MS inputted from the input terminal 1 into two, one outputted to the drain of a transistor 31 (described later) in the wave-shaping circuit 3 and the other outputted to the amplitude adjuster 7.

The wave-shaping circuit 3 shapes the waveform of the received multi-level signal MS according to a control signal CS (described later) outputted from the control signal generator 10 so that the detector 4 can correctly detect a first reference level $RL_1$ (described later). For this purpose, the wave-shaping circuit 3 exemplarily includes the transistor 31 and two resistors 32 and 33.

The drain of the transistor 31 is coupled to the first branching part 2, while its source is coupled to the anode of a diode 41 of the detector 4. Further, the resistor 32 is placed between the drain and source. The source is also coupled to the reference level generator 5 through the resistor 33. The gate of the transistor 31 is coupled to an output terminal of the control signal generator 10.

Resistances $R_{32}$ and $R_{33}$ of the resistors 32 and 33, respectively, are determined according to the format of the multi-level signal MS and/or the specifications of the discriminator D1. An example of the resistances $R_{32}$ and $R_{33}$ is now described. In the first embodiment, assume that the first reference level $RL_1$ is selected to be substantially equal in electric potential to the amplitude value "X". Also assume that the wave-shaping circuit 3 adjusts the amplitude value "W" to the first reference level $RL_1$ according to the specifications of the discriminator D1. Under these assumptions, the resistances $R_{32}$ and $R_{33}$ are selected to be at a ratio of 1:2.

The gate of the transistor 31 is provided with the control signal CS from the control signal generator 10. As will be described in detail, when determining that the amplitude value "W" is excessively distributed in the multi-level signal MS, the control signal generator 10 generates a control signal CS having a "Hi" level. Otherwise, the control signal generator 10 generates a control signal CS having a "Lo" level (refer to FIG. 1b).

"Hi" of the control signal CS brings the transistor 31 out of conduction. In this case, the wave-shaping circuit 3 divides the voltage of the output signal from the first branching part 2 with the resistors 32 and 33, and then outputs the voltage-divided signal to the anode of the diode 41.

"Lo" of the control signal CS brings the transistor 31 into conduction. As a result, the multi-level signal MS from the first branching part 2 is directly fed to the anode of the diode 41.

Described next is one specific example of the operation of the wave-shaping circuit 3. As evident from above, with the multi-level signal MS having a waveform as shown in FIG. 1a fed to the discriminator D1, the control signal generator 10 inputs to the transistor 31 the control signal CS indicative of "Hi" during the time interval $T_2$, and the control signal CS indicative of "Lo" during the time intervals $T_1$, and $T_3$ (refer to FIG. 1b) Therefore, the wave-shaping circuit 3 inputs the multi-level signal MS from the first branching part 2 to the anode of the diode 41 during the time intervals $T_1$ and $T_3$. On the other hand, during the time interval $T_2$, the wave-shaping circuit 3 first divides the voltage of the multi-level signal MS from the first branching part 2, and then outputs a signal $OS_3$ to the anode of the diode 41. Consequently, since the input multi-level signal MS is attenuated to two-thirds during the time interval $T_2$, the waveform of the output signal $OS_3$ from the wave-shaping circuit 3 becomes as such shown in FIG. 1c, with its peak value during the time interval $T_2$ substantially equal in electric potential to the amplitude value "X".

Referring back to FIG. 2, the detector 4 detects the first reference level $RL_1$ from the output signal $OS_3$. For this purpose, the detector 4 preferably includes the diode 41, a capacitor 42, a transistor 43, and a current source 44.

The anode of the diode 41 is coupled to the source of the transistor 31, while its cathode is coupled to the gate of the transistor 43. The cathode is further grounded through the capacitor 42. The drain of the transistor 43 is coupled to a constant-voltage power supply (not shown), while its source is grounded through the current source 44. The source of the transistor 43 is further coupled to a resistor 61 (described later) of the threshold generator 6.

In the detector 4 of the above described structure, a threshold $V_{th}$ of the diode 41 is selected to be substantially equal in electric potential to the first reference level $RL_1$. Provided with the output signal $OS_3$ through the diode 41, the capacitor 42 is charged until an input voltage $V_i$ becomes equal to an output voltage $V_o$. As such, the capacitor 42 detects a peak value of the output signal $OS_3$, and outputs the peak value to one end of the resistor 61 as the first reference level $RL_1$.

The transistor 43 and the current source 44 compose a buffer for cutting off discharge pass from the capacitor 42. This buffer allows the capacitor 42 to hold the peak value of the output signal $OS_3$ with stability, without being affected by output impedance from the detector 4.

Described next is one specific example of the operation of the detector 4. In the first embodiment, the anode of the diode 41 is provided with the signal shown in FIG. 1c. The capacitor 42 detects and holds the amplitude value "X" as the first reference level $RL_1$. Therefore, as shown in FIG. 1d, the first reference level $RL_1$ from the detector 4 has an electric potential that is constant in time and equal to the amplitude value "X".

The reference level generator 5 generates a second reference level $RL_2$ for the multi-level signal MS. In the preferred embodiment, assume that the second reference level $RL_2$ is selected to be substantially equal in electric potential to a base level of the multi-level signal MS (that is, amplitude value "Z"). Furthermore, in the first embodiment, the optical receiver Rx is placed at front of the discriminator D1. In such case, the reference level generator 5 is preferably constructed of a dummy optical receiver 51. The dummy optical receiver 51 has the same input/output characteristics as those of the optical receiver Rx placed at front of the discriminator D1. An output terminal of the dummy optical receiver 51 is coupled to the resistor 33, a resistor 64 (described later) of the threshold generator 6, and a resistor 72 (described later) of the amplitude adjuster 7. From this output terminal, an electric potential when the multi-level signal MS is not transmitted is outputted as the second reference level $RL_2$.

In the first embodiment, the optical receiver Rx outputs the multi-level signal MS shown in FIG. 1a to the input terminal 1. Therefore, from the output terminal of the dummy optical receiver 51, the base level of the multi-level signal MS (amplitude value "Z") is outputted as the second reference level $RL_2$.

When the optical receiver Rx is not placed at front of the discriminator D1 (that is, in electrical transmission), the reference level generator 5 is preferably constructed of a reference electric potential generator. The reference electric potential generator generates an electric potential equal to the base level of the multi-level signal MS (that is, amplitude value ("Z").

The threshold generator 6 generates thresholds as much as they are required according to the first reference level $RL_1$ from the detector 4 and the second reference level $RL_2$ from the reference level generator 5. In the first embodiment, the multi-level signal MS has four levels, and therefore three thresholds $Th_1$, $Th_2$, and $Th_3$ are required to be generated. Therefore, the threshold generator 6 includes four resistors 61 to 64, and three lead lines 65 to 67. The resistors 61 to 64 are coupled in series between the source of the transistor 43 and the output terminal of the reference level generator 5. The adjacent two resistors 61 and 62 are tapped at the node of these resistors by the lead line 65 that goes to a comparator 82 (described later) of the comparing circuit 8. The resistors 62 and 63 are tapped at the node of these resistors by the lead line 66 that goes to a comparator 83 (described later) of the comparing circuit 8. The resistors 63 and 64 are tapped at the node of these resistors by the lead line 67 that goes to a comparator 84 (described later) of the comparing circuit 8.

The amplitude adjuster 7 adjusts the relative level difference between the amplitude of the multi-level signal MS directly outputted from the first branching part 2 and the thresholds generated in the threshold generator 6. For achieving such adjustment, the amplitude adjuster 7 exemplarily includes two resistors 71 and 72, and a lead line 73. The resistors 71 and 72 are coupled in series between an output terminal of the first branching part 2 and the output terminal of the reference level generator 5. The resistors 71 and 72 are tapped at the node of these resistors by the lead line 73 that goes to a second branching part 81 of the comparing circuit 8.

Figure 3:
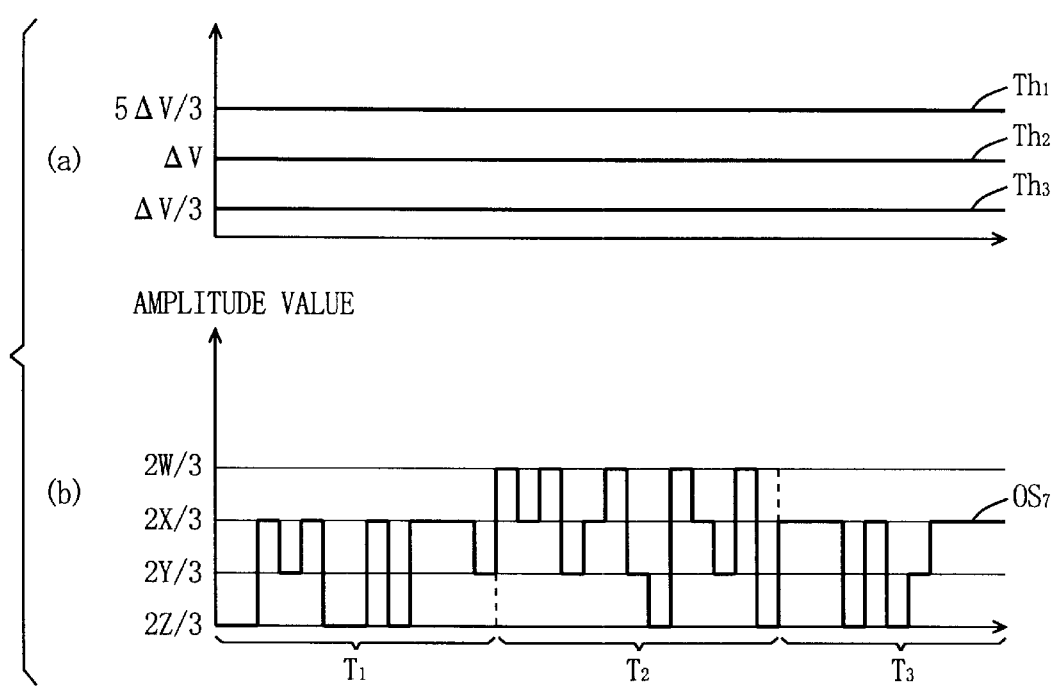
FIG. 3a is a diagram showing values of thresholds $Th_1$, $Th_2$, and $Th_3$.
FIG. 3b is a diagram showing the waveform of an output signal $OS_7$.

Here, described is an example of resistances $R_{61}$ to $R_{64}$ of the resistors 61 to 64 and resistances $R_{71}$ and $R_{72}$ of the resistors 71 and 72. The resistances $R_{61}$ to $R_{64}$, $R_{71}$ and $R_{72}$ are determined according to the format of the multi-level signal MS and/or the specifications of the discriminator D1, and these resistances are related one another. For example, assume that the resistances $R_{61}$ to $R_{64}$ are selected to satisfy the relation of $R_{61}:R_{62}:R_{63}:R_{64}=1:2:2:1$. Further, one input terminal of the threshold generator 6 is provided with the first reference level $RL_1$ (which is equal to the amplitude value "X" in electric potential), while the other input terminal provided with the second reference level $RL_2$ (which is equal to the amplitude value "Z" in electric potential). In this case, the thresholds $Th_1$, $Th_2$, and $Th_3$ have values of 5X/6, X/2, and X/6, respectively, relative to the second reference level $RL_2$. Here, the amplitude value "X" is $2\Delta V$ relative to the amplitude value "Z". Therefore, as shown in FIG. 3a, the threshold generator 6 inputs to the comparing circuit 8 thresholds $Th_1=5\Delta V/3$, $Th_2=\Delta V$, and $Th_3=\Delta V/3$ through the lead lines 65, 66, and 67, respectively.

In general, it is preferred for amplitude discrimination of the multi-level signal MS shown in FIG. 1a that each of three thresholds $Th_1'$, $Th_2'$, and $Th_3'$ be selected at a center level between one amplitude level and the amplitude level just one level below or above, normally $5\Delta V/2$, $3\Delta V/2$, and $\Delta V/2$, respectively, relative to the amplitude value "Z". In this case, the following equation holds: $(Th_1/Th_1')=(Th_2/Th_2')=(Th_3/Th_3')=\frac{2}{3}$. Therefore, for correct amplitude discrimination of the multi-level signal MS outputted from the first branching part 2 with the thresholds $Th_1$, $Th_2$, and $Th_3$, the resistances $R_{71}$ and $R_{72}$ are preferably selected to be at a ratio of 1:2. In such case, the amplitude adjuster 7 divides the voltage of the multi-level signal MS branched by the branching part 2 to generate a signal $OS_7$ with an amplitude equal to $\frac{2}{3}$ of that of the branched multi-level signal MS shown in FIG. FIG. 3b. Then, the amplitude adjuster 7 outputs the generated signal $OS_7$ to the comparing circuit 8.

The comparing circuit 8 compares the amplitude of the signal $OS_7$ outputted from the amplitude adjuster 7 with the thresholds $Th_1$, $Th_2$, and $Th_3$ from the threshold generator 6. The comparison result indicates discrimination result of the multi-level signal MS inputted to the discriminator D1. In general, for discrimination of a four-level signal, the comparing circuit 8 includes the second branching part 81 and the three comparators 82 to 84. The second branching part 81 branches the signal $OS_7$ outputted from the amplitude adjuster 7 into three. Each of the comparators 82 to 84 is provided with the branched signal $OS_7$. The comparators 82 to 84 are further provided with the thresholds $Th_1$ to $Th_3$ through the lead lines 65 to 67, respectively. The comparator 82 compares magnitudes between the amplitude of the received signal $OS_7$ and the threshold $Th_1$, and outputs the result represented by "Hi" or "Lo". Similarly, the comparators 83 and 84 compare magnitudes between the amplitude of the received signal $OS_7$ and the thresholds $Th_2$ and $Th_3$, respectively, and output the results represented by "Hi" or "Lo".

The comparing circuit 8 outputs the result of each of the comparators 82 to 84 to an external device through output terminals 91 to 93 included in the output terminal group 9. The result outputted from each of the output terminals 91 to 93 indicates a discrimination result for each symbol of the multi-level signal MS.

With the above described configuration, when the amplitude of the multi-level signal MS inputted to the discriminator D1 is "W", all comparators 82 to 84 output the results indicative of "Hi" through the output terminals 91 to 93 to the external device. When the amplitude value is "X", only the comparators 83 and 84 output the results indicative of "Hi" through the output terminals 92 and 93. When the amplitude value is "Y", only the comparator 84 outputs the result indicative of "Hi" through the output terminal 93. When the amplitude value is "Z", all comparators 82 to 84 output the results indicative of "Lo" through the output terminals 91 to 93.

The above results are also transmitted to the control signal generator 10. By way of example only, a comparison result {Hi, Hi, Hi} indicates that all comparators 82 to 84 output the results indicative of "Hi". a comparison result {Lo, Hi, Hi} indicates that only the comparators 83 and 84 output the results indicative of "Hi". A comparison result {Lo, Lo, Hi} indicates that only the comparator 84 outputs the result indicative of "Hi". A comparison result {Lo, Lo, Lo} indicates that all comparators 82 to 84 output the results indicative of "Lo".

The control signal generator 10 is implemented typically by a CPU (Central Processing Unit), FPGA (Field Programmable Gate Array), or a logic circuit. Based on the comparison result from the comparing circuit 8, the control signal generator 10 generates the control signal CS (refer to FIG. 1b), and outputs the control signal CS to the gate of the transistor 31. Described below is an example of methods for generating the control signal CS.

The control signal generator 10 repeatedly receives the comparison result of parallel 3 bits at approximately regular intervals. The control signal generator 10 stores a predetermined number $N_{PRE}$ of latest comparison results arrived therein. The control signal generator 10 then counts the number of the comparison results {Hi, Hi, Hi} among the $N_{PRE}$ comparison results currently stored therein. The control signal generator 10 then determines whether a number $N_W$ of comparison results {Hi, Hi, Hi} is larger than a reference number $N_{REF}$.

When determining $N_W > N_{REF}$, the control signal generator 10 assumes that the amplitude value "W" is excessively distributed in the multi-level signal MS that the discriminator D1 currently received, and generates the control signal CS indicative of "Hi".

On the other hand, when determining $N_W \leq N_{REF}$, the control signal generator 10 assumes that the amplitude value "W" is not excessively distributed in the multi-level signal MS the discriminator D1 currently received, and generates the control signal CS indicative of "Lo".

The control signal CS is generated as described above. According to this generation method, with the multi-level signal MS of FIG. 1a inputted to the discriminator D1, the control signal CS substantially indicative of "Lo" is generated during the time intervals $T_1$ and $T_3$, and sent to the wave-shaping circuit 3. The control signal CS substantially indicative of "Hi" is generated during the time interval $T_2$, and sent to the wave-shaping circuit 3. Note that the time intervals of the control signals CS indicative of "Hi" and "Lo" of the control signal CS may be slightly shifted depending on $N_{PRE}$, $N_W$, and $N_{REF}$ selected.

Figure 12:
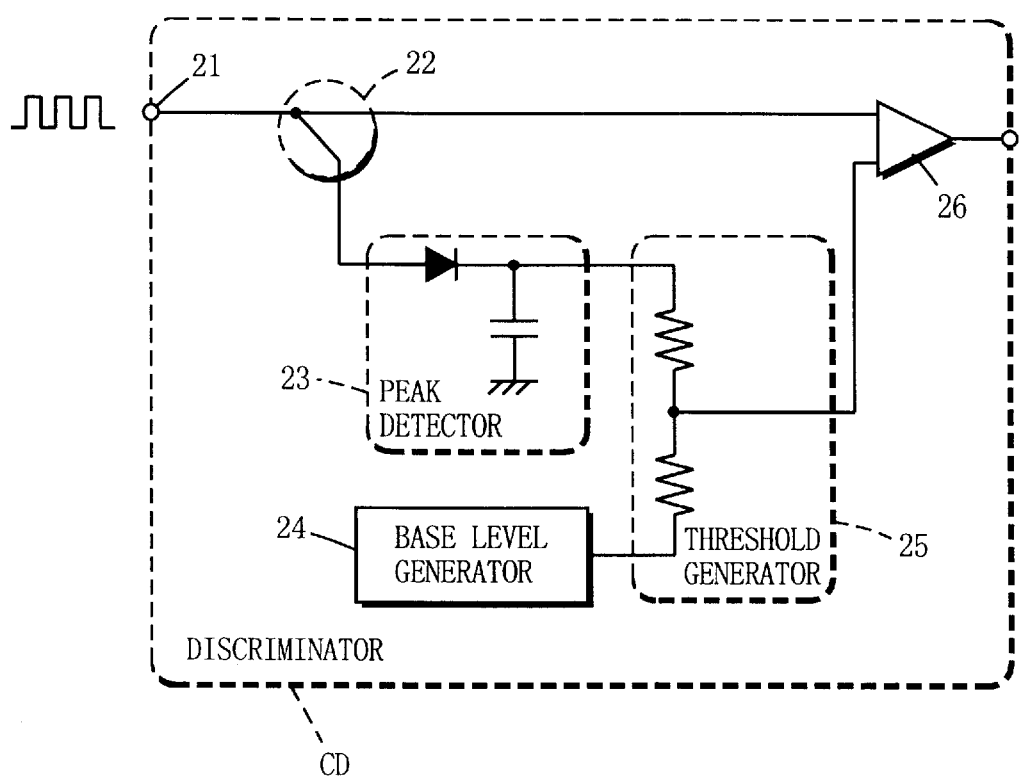
FIG. 12 is a circuit diagram showing the entire configuration of a conventional discriminator CD.

Described next is technical effects of the discriminator D1. When the conventional discriminator CD (refer to FIG. 12) is applied for discrimination of the multi-level signal MS, the peak detector 23 is provided with the multi-level signal MS without wave-shaping. Therefore, the charge electric potential of its capacitor equal to the amplitude value "W" or "X", and becomes unstable. Consequently, the discriminator CD cannot generate correct thresholds and cannot perform correct amplitude discrimination of the multi-level signal MS in which one or more specific amplitude values are excessively distributed during a certain time interval (refer to FIG. 1a). In such case, the transmitting side has to generate a multi-level signal in which its maximum amplitude value appears at predetermined regular intervals and each amplitude value is moderately distributed.

On the other hand, according to the discriminator D1, with the multi-level signal MS as shown in FIG. 1a inputted thereto, the control signal CS indicates "Hi" during the time interval $T_2$, bringing the switch (transistor 31) out of conduction during that time interval. As a result, the wave-shaping circuit 3 divides the voltage of the amplitude of the multi-level signal MS into two-thirds during the time interval in which the amplitude value "W" is excessively distributed in the multi-level signal MS, such as the time interval $T_2$. Therefore, the charge electric potential of the capacitor 42 is not over the first reference level $RL_1$, which becomes constant at the electric potential equal to that of the amplitude value "X". Therefore, the threshold generator 6 can generate constant thresholds $Th_1$, $Th_2$, and $Th_3$, allowing correct discrimination of the multi-level signal MS.

As clear from above, the discriminator D1 can correctly perform amplitude discrimination of even the received multi-level signal MS in which one or more specific amplitude values are concentrated during a certain time interval (refer to FIG. 1a). This amplitude discrimination enables generation of the multi-level signal MS in the transmitting side with less restrictions than ever before.

In the first embodiment, the amplitude adjuster 7 is placed between the first branching part 2 and the comparing circuit 8, attenuating the received multi-level signal MS. However, the amplitude adjuster 7 may be placed at other positions as long as it can adjust the relative level difference between the branched multi-level signal MS and the thresholds, as describe above. For example, the amplitude adjuster 7 may be placed between the first branching part 2 and the wave-shaping circuit 3, between the wave-shaping circuit 3 and the detector 4, between the detector 4 and the threshold generator 6, or between the threshold generator 6 and the comparing circuit 8. In such arrangement, the first branching part 2 and the comparator 8 are directly coupled, and therefore the multi-level signal MS as shown in FIG. 1a is inputted to each of the comparators 82 to 84. Therefore, the amplitude adjuster 7 placed as such is implemented by an amplifier, amplifying the received signal by 1.5 times. Note that the discriminator D1 may be configured to include two or more amplitude adjusters 7.

Furthermore, in the first embodiment, the wave-shaping circuit 3 inputs the signal shown in FIG. 1c to the detector 4, and the first reference level $RL_1$ is selected to be equal in electric potential to the amplitude value "X". Therefore, the detector 4 has the structure to detect the peak value of the received signal. The detector 4, however, may have the structure as shown in FIG. 4a, on condition that the voltage-division ratio of the resistances $R_{61}$ to $R_{64}$ and/or the resistances $R_{71}$ and $R_{72}$ also be appropriately selected since the first reference level $RL_1$ is equal in electric potential to the average value of the input signal to the detector 4.

Figure 5:
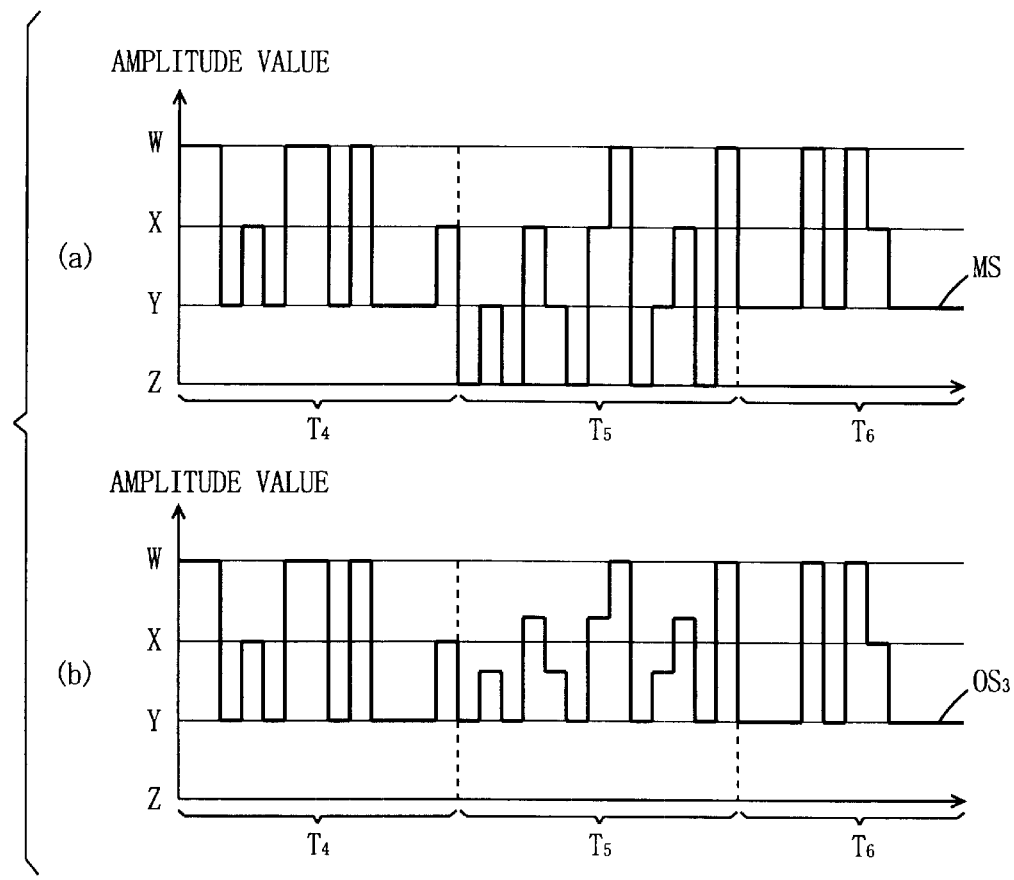
FIG. 5a is a diagram showing another waveform of the multi-level signal MS.
FIG. 5b is a diagram showing another waveform of the output signal $OS_3$.

Still further, in the first embodiment, the wave-shaping circuit 3 is implemented by a voltage-divider. However, the wave-shaping circuit 3 may be implemented by an amplifier capable of varying its amplification factor with the control signal CS as shown in FIG. 4b. For example, assume that the discriminator D1 is provided with a multi-level signal MS as shown in FIG. 5a. In the multi-level signal MS of FIG. 5a, the amplitude value "Z" is not present during time intervals $T_4$ and $T_6$, but the amplitude value "Y" is moderately distributed. Further, the amplitude value "Z" is excessively distributed during a time interval $T_5$. The amplification factor of the amplifier shown in FIG. 4b is set to ⅔ during the time interval $T_5$, amplifying (attenuating) the amplitude of the received multi-level signal MS to two-thirds relative to the amplitude value "W". During the time intervals $T_4$ and $T_6$, the amplification factor is set to 1. As a result, as shown in FIG. 5b, an output signal having a bottom value equal in electric potential to the amplitude value "Y" appears at the output terminal of the amplifier, and inputted to the detector 4.

The detector 4 is preferably structured as shown in FIG. 4b, if the signal as shown in FIG. 5b is inputted. However, in the structure of FIG. 4b, the first reference level $RL_1$ is equal in electric potential to the bottom value of the input signal to the detector 4. Therefore, the voltage-division ratio of the resistances $R_{61}$ to $R_{64}$ and/or the resistances $R_{71}$ and $R_{72}$ also has to be appropriately selected.

Still further, a transistor may be coupled to between the detector 4 as shown in FIGS. 2, 4a, or 4b and the wave-shaping circuit 3 as shown in FIG. 2 or 4b, to compose a buffer.

Still further, it is preferable that the detector 4 output the first reference level $RL_1$ as quickly as possible, and thus operate within the minimum pulse width of the received multi-level signal MS. More specifically, it is preferable that the control rate from generation of the control signal CS in the control signal generator 10 to wave-shaping of the multi-level signal MS in the wave-shaping circuit 3 according to the control signal CS be larger than a slewing rate for detecting the first reference level $RL_1$ in the detector 4.

Still further, the reference level generator 5 generates the second reference level $RL_2$ according to the control signal CS from the control signal generator 10, thereby allowing optimization of the second reference level $RL_2$.

Figure 6:
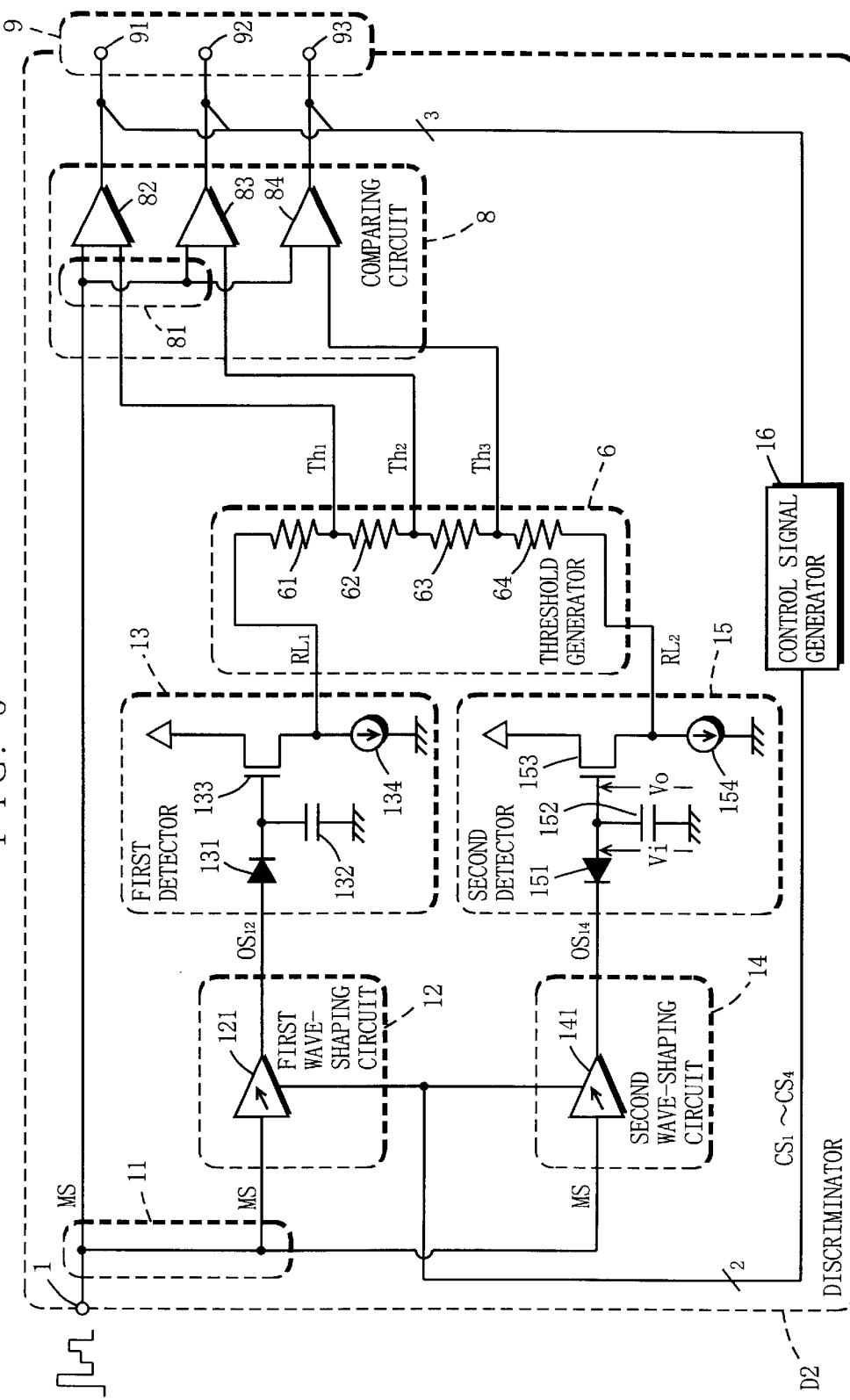
FIG. 6 is a circuit diagram showing the whole configuration of a discriminator D2 according to a second embodiment.

Described next is a discriminator D2 according to a second embodiment of the present invention. FIG. 6 shows a circuit structure of the discriminator D2 in detail. In FIG. 6, the discriminator D2 includes the input terminal 1, a first branching part 11, a first wave-shaping circuit 12, a first detector 13, a second wave-shaping circuit 14, a second detector 15, the threshold generator 6, the comparing circuit 8, the output terminal group 9, and a control signal generator 16. Note that in the discriminator D2, components corresponding to those in the discriminator D1 are provided with the same reference numerals.

Figure 7:
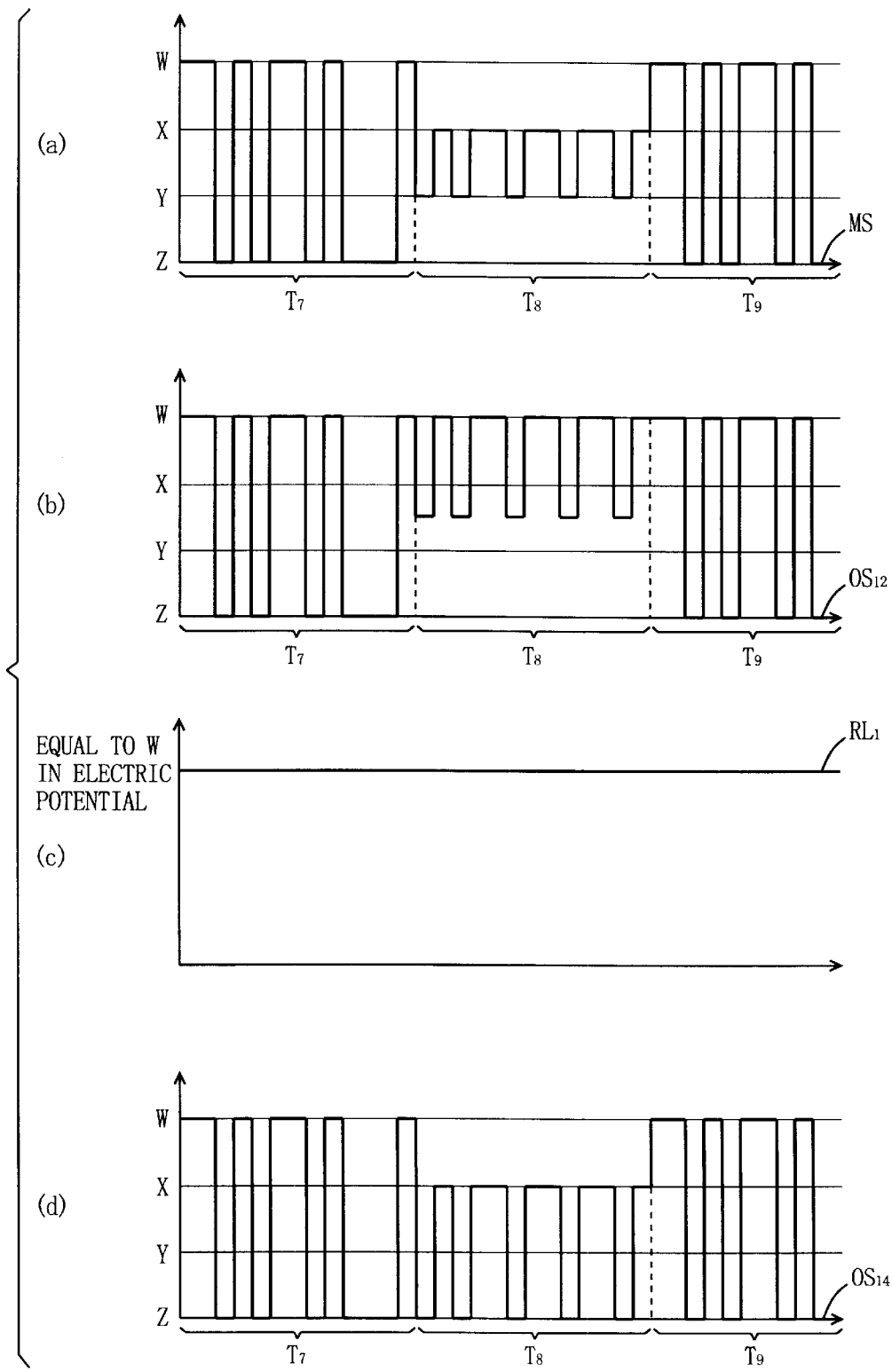
FIG. 7a is a diagram showing the waveform of a multi-level signal MS according to the second and third embodiments.
FIG. 7b is a diagram showing the waveform of an output signal $OS_{12}$.
FIG. 7c is a diagram showing a value of the first reference level $RL_1$ according to the second and third embodiments.
FIG. 7d is a diagram showing the waveform of an output signal $OS_{14}$.

The first branching part 11 is provided with a multi-level signal MS as shown in FIG. 7a through the input terminal 1. Here, assume that the multi-level signal MS of FIG. 7a is a signal in which each symbol is represented by any one of four amplitude values "W", "X", "Y", and "Z", similarly to the multi-level signal MS of FIG. 1a. Further, assume that $|W-X|=|X-Y|=|Y-Z|=\Delta V$. Also in the multi-level signal MS of FIG. 7a, one or more specific amplitude values may be concentrated during a certain time interval. In FIG. 7a, the amplitude values "X" and "Y" are excessively distributed in the multi-level signal MS during a time interval $T_8$, while not excessively distributed during time intervals $T_7$ and $T_9$.

The first branching part 11 branches the above multi-level signal MS into three. The branched multi-level signal MS is outputted to the comparing circuit 8, the first wave-shaping circuit 12, and the second wave-shaping circuit 14.

According to a control signal CS (described later) transmitted from the control signal generator 16, the first wave-shaping circuit 12 shapes the waveform of the received multi-level signal MS so that the first detector 13 can correctly detect a first reference level $RL_1$ (described later). For such wave-shaping, the first wave-shaping circuit 12 exemplarily includes a first amplifier 121. An input terminal of the first amplifier 121 is coupled to the first branching part 11, while an output terminal thereof coupled to the anode of a first diode 131 of the first detector 13. The first amplifier 121 is further coupled to the control signal generator 16 through a 2-bit bus.

Figures 8, 9:
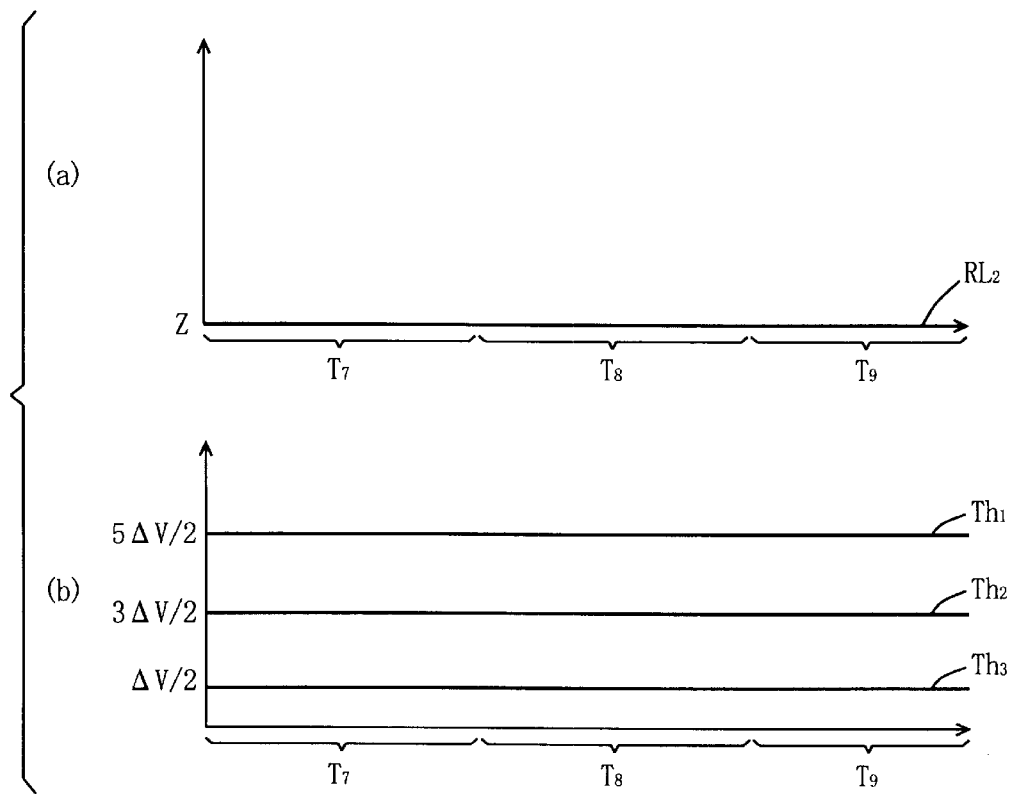
FIG. 8 is a diagram illustrating the control signal CS according to the second and third embodiments.

To the first amplifier 121, the control signal CS is transmitted from the control signal generator 16. In the second embodiment, the control signal CS is composed of parallel 2 bits. The control signal CS has, as shown in FIG. 8, four patterns. A first control signal $CS_1$ indicates that its 2 bits both represent "Hi" and that the amplitude values "X" and "Y" are excessively distributed in the multi-level signal MS that the discriminator D2 currently received. A second control signal $CS_2$ indicates that its 2 bits represent both "Lo" and that the amplitude values "X" and "Y" are not excessively distributed therein. A third control signal $CS_3$ indicates that the bit on one line of the bus represents "Hi" and the bit on the other represents "Lo", and that the amplitude value "X" is excessively distributed therein. A fourth control signal $CS_4$ indicates that the bit on one line of the bus represents "Lo" and the bit on the other represents "Hi", and that the amplitude value "Y" is excessively distributed therein.

An amplification factor (gain) $A_{121}$ of the first amplifier 121 is set differently according to the first to fourth control signals $CS_1$ to $CS_4$. The amplification factor $A_{121}$ is also determined according to the format of the multi-level signal MS and/or the specifications of the discriminator D2. Described below is an example of the amplification factor $A_{121}$.

When the first amplifier 121 receives the first or third control signal $CS_1$ or $CS_3$, its amplification factor $A_{121}$ is set to W/X relative to the base level of the multi-level signal MS (amplitude value "Z"). In the second embodiment, W/X is 1.5. On the other hand, when the first amplifier 121 receives the second or fourth control signal $CS_2$ or $CS_4$, its amplification factor $A_{121}$ is set to 1.

Described next is one specific example of the operation of the first wave-shaping circuit 12 as structured above. With the multi-level signal MS of FIG. 7a inputted to the discriminator D2, the second control signal $CS_2$ is sent to the first amplifier 121 during the time intervals $T_7$ and $T_9$. The amplification factor $A_{121}$ is thus set to 1. As a result, the first amplifier 121 directly outputs the received multi-level signal MS to the first diode 131.

The first control signal $CS_1$ is sent to the first amplifier 121 during the time interval $T_8$. The amplification factor $A_{121}$ is thus set to 1.5 relative to the base level, and the amplitude of the received multi-level signal MS is amplified with the amplification factor $A_{121}$.

As such, the first wave-shaping circuit 12 shapes the waveform of the received multi-level signal MS. Consequently, since the amplitude of the received multi-level signal MS is amplified relative to the base level during the time interval $T_8$, the waveform of an output signal $OS_{12}$ becomes as such shown in FIG. 7b, with its peak value during the time interval $T_8$ substantially equal in electric potential to the amplitude value "W".

Referring back to FIG. 6, the first detector 13 detects the first reference level $RL_1$ from the signal outputted from the first wave-shaping circuit 12. For this detection, the first detector 13 preferably includes. the first diode 131, a first capacitor 132, a first transistor 133, and a first current source 134. Since this circuit structure is similar to that of the detector 4 in FIG. 2, its description of operation is simplified herein.

In the first detector 13, a threshold $V_{th}$ of the first diode 131 is selected to be substantially equal to the first reference level $RL_1$ in electric potential. The first capacitor 132 is provided with a signal $OS_{12}$ through the first diode 131, and charged until the input voltage $V_i$ becomes equal to the output voltage $V_o$. As such, the first capacitor 132 detects the peak value of the output signal $OS_{12}$, and outputs the peak value to one terminal of the resistor 61 as the first reference level $RL_1$ as shown in FIG. 7c.

Referring back to FIG. 6, the second wave-shaping circuit 14 shapes the waveform of the multi-level signal MS from the first branching part 11 according to the control signal CS from the control signal generator 16 (refer to FIG. 8) so that the second detector 15 can correctly detect the second reference level $RL_2$ (described later). For this purpose, the second wave-shaping circuit 14 exemplarily includes a second amplifier 141. An input terminal of the second amplifier 141 is coupled to the first branching part 11, while an output terminal thereof is coupled to the cathode of a second diode 151 of the second detector 5. The second amplifier 141 is further coupled to the control signal generator 16 through a 2-bit bus.

An amplification factor $A_{141}$ of the second amplifier 141 has different values according to the above described first to fourth control signals $CS_1$ to $CS_4$. The amplification factor $A_{141}$ is also determined according to the format of the multi-level signal MS and/or the specifications of the discriminator D2. Described is an example of the amplification factor $A_{141}$.

When the second amplifier 141 receives the first or fourth control signal $CS_1$ or $CS_4$, the amplification factor $A_{141}$ is set to Z/Y relative to the amplitude value "W" of the multi-level signal MS. In the second embodiment, Z/Y is 1.5. On the other hand, when the second amplifier 141 receives the second or third control signal $CS_2$ or $CS_3$, the amplification factor $A_{141}$ is set to 1.

Described next is one specific example of the operation of the second wave-shaping circuit 14 as structured above. With the multi-level signal MS of FIG. 7a inputted to the discriminator D2, the second control signal $CS_2$ is sent to the second amplifier 141 during time intervals $T_7$ and $T_9$. The amplification factor $A_{141}$ is thus set to 1. Consequently, the second amplifier 141 directly inputs the multi-level signal MS from the first branching part 11 to the cathode of the second diode 151.

On the other hand, the first control signal $CS_1$ is sent to the second amplifier 141 during the time interval $T_8$. The amplification factor $A_{141}$ is thus set to 1.5. Consequently, the second amplifier 141 amplifies the amplitude of the received multi-level signal MS by 1.5 times relative to the amplitude value "W", and outputs a signal $OS_{14}$ to the cathode of second diode 151.

The second wave-shaping circuit 14 performs such wave-shaping as that the amplitude of the received multi-level signal MS is amplified by 1.5 times relative to the amplitude value "W" during the time interval $T_8$. Consequently, the waveform of the output signal $OS_{14}$ becomes as such shown in FIG. 7d, with its bottom value during the time interval $T_8$ substantially equal in electric potential to the amplitude value "Z".

Referring back to FIG. 6, the second detector 15 detects the second reference level $RL_2$ from the output signal $OS_{14}$ from the second wave-shaping circuit 14. For this detection, the second detector 15 preferably includes the second diode 151, a second capacitor 152, a second transistor 153, and a second current source 154.

The cathode of the second diode 151 is coupled to the output terminal of the second amplifier 141, while its anode is coupled to the gate of the second transistor 153. The anode is further grounded through the second capacitor 152. The drain of the second transistor 153 is coupled to a constant-voltage source not shown, and its source is grounded through the second current source 154. The source is further coupled to one end of the resistor 64 (described later) of the threshold generator 6.

In the above structured second detector 15, a threshold $V_{th}$ of the second diode 151 is selected to be substantially equal in electric potential to the second reference level $RL_2$. The second capacitor 152 is provided with the output signal $OS_{14}$ through the second diode 151, and charged until the input voltage $V_i$ becomes equal to the output voltage $V_o$. As such, the second capacitor 152 detects the bottom value of the output signal $OS_{14}$, and outputs the bottom value to one terminal of the resistor 64 as the second reference level $RL_2$.

The second transistor 153 and the current source 154 compose a buffer for cutting off discharge pass from the second capacitor 152. This buffer allows the second capacitor 152 to hold the bottom value of the output signal $OS_{14}$ with stability.

In the second embodiment, the cathode of the second diode 151 is provided with the signal $OS_{14}$ having a waveform shown in FIG. 7d. The second reference level $RL_2$ is, as shown in FIG. 9a, constant in time and equal in electric potential to the amplitude value "Z".

The function and structure of the threshold generator 6 and the comparing circuit 8 have been described in the first embodiment, and therefore their description is omitted herein. In the second embodiment, however, the threshold generator 6 is provided with the amplitude value "W" as the first reference level $RL_1$ and the amplitude value "Z" as the second reference level $RL_2$. Thus, three thresholds $Th_1$, $Th_2$, and $Th_3$ to be generated therein are selected as $Th_1 = 5\Delta V/2$, $Th_2 = 3\Delta V/2$, and $Th_3 = \Delta V/2$.

The comparator 82 compares magnitudes between the amplitude of the received multi-level signal MS and the received threshold $Th_1$, and outputs the result represented by "Hi" or "Lo". The comparator 83 compares magnitudes between the amplitude of the received multi-level signal MS and the threshold $Th_2$, and outputs the result represented by "Hi" or "Lo". The comparator 84 compares magnitudes between the amplitude of the received multi-level signal MS and the threshold $Th_3$, and outputs the result represented by "Hi" or "Lo". The result of each of the comparators 82 to 84 indicates a discrimination result for each symbol of the multi-level signal MS. Through the output terminals 91 to 93 included in the output terminal group 9, these results are outputted to an external device.

These results are further sent to the control signal generator 16. Here, a comparison result {Hi, Hi, Hi} indicates that all comparators 82 to 84 output the results indicative of "Hi". A comparison result {Lo, Hi, Hi} indicates that only the comparators 83 and 84 output the results indicative of "Hi". A comparison result {Lo, Lo, Hi} indicates that only the comparator 84 outputs the result indicative of "Hi". A comparison result {Lo, Lo, Lo} indicates that all comparators 82 to 84 output the results indicative of "Lo".

The control signal generator 16 is implemented typically by a CPU, FPGA, or a logic circuit. Based on the comparison result from the comparing circuit 8, the control signal generator 16 generates the control signal CS (see FIG. 8) and transmits it to the first and second wave-shaping circuits 12 and 14 through a 2-bit bus. The method of generating the control signal CS is also determined according to the format of the multi-level signal MS and/or the specifications of the discriminator D2. One example of the method in the second embodiment is now described.

The control signal generator 16 repeatedly receives the comparison result of parallel 3 bits at approximately regular intervals. The control signal generator 16 stores a predetermined number $N_{PRE}$ of comparison results recently received therein. The control signal generator 16 then counts the number of the comparison results {Lo, Hi, Hi} among the $N_{PRE}$ comparison results currently stored therein. The control signal generator 16 then determines whether a number $N_X$ of comparison results {Lo, Hi, Hi} is larger than a first reference number $N_{REF1}$.

The control signal generator 16 further counts the number of the comparison results {Lo, Lo, Hi} among the comparison results currently stored therein. The control signal generator 16 then determines whether a number $N_Y$ of comparison results {Lo, Lo, Hi} is larger than a second reference number $N_{REF2}$.

When determining $N_X > N_{REF1}$ and $N_Y > N_{REF2}$, the control signal generator 16 assumes that the amplitude values "X" and "Y" are excessively distributed in the multi-level signal MS currently being received, and generates the first control signal $CS_1$.

On the other hand, when determining $N_X \leq N_{REF1}$ and $N_Y \leq N_{REF2}$, the control signal generator 16 assumes that the amplitude values "X" and "Y" are not excessively distributed therein, and generates the second control signal $CS_2$.

When determining $N_X > N_{REF1}$ and $N_Y \leq N_{REF2}$, the control signal generator 16 assumes that the amplitude value "X" is excessively distributed therein, and generates the third control signal $CS_3$.

When determining $N_X \leq N_{REF1}$ and $N_Y > N_{REF2}$, the control signal generator 16 assumes that the amplitude value "Y" is excessively distributed therein, and generates the fourth control signal $CS_4$.

According to this generation method, with the multi-level signal MS of FIG. 7a inputted to the discriminator D2, the second control signal $CS_2$ is sent to the first and second wave-shaping circuits 12 and 14 during the time intervals $T_7$ and $T_9$, and the first control signal $CS_1$ is sent thereto during the time interval $T_8$.

The above discriminator D2 can also attain the technical effects similar to those of the discriminator D1. The discriminator D2 can correctly discriminate the amplitude of even the received multi-level signal MS in which one or more specific amplitude values are excessively distributed during a certain time interval (refer to FIG. 7a). This amplitude discrimination enables generation of the multi-level signal MS in the transmitting side with less restrictions than ever before.

Figure 10:
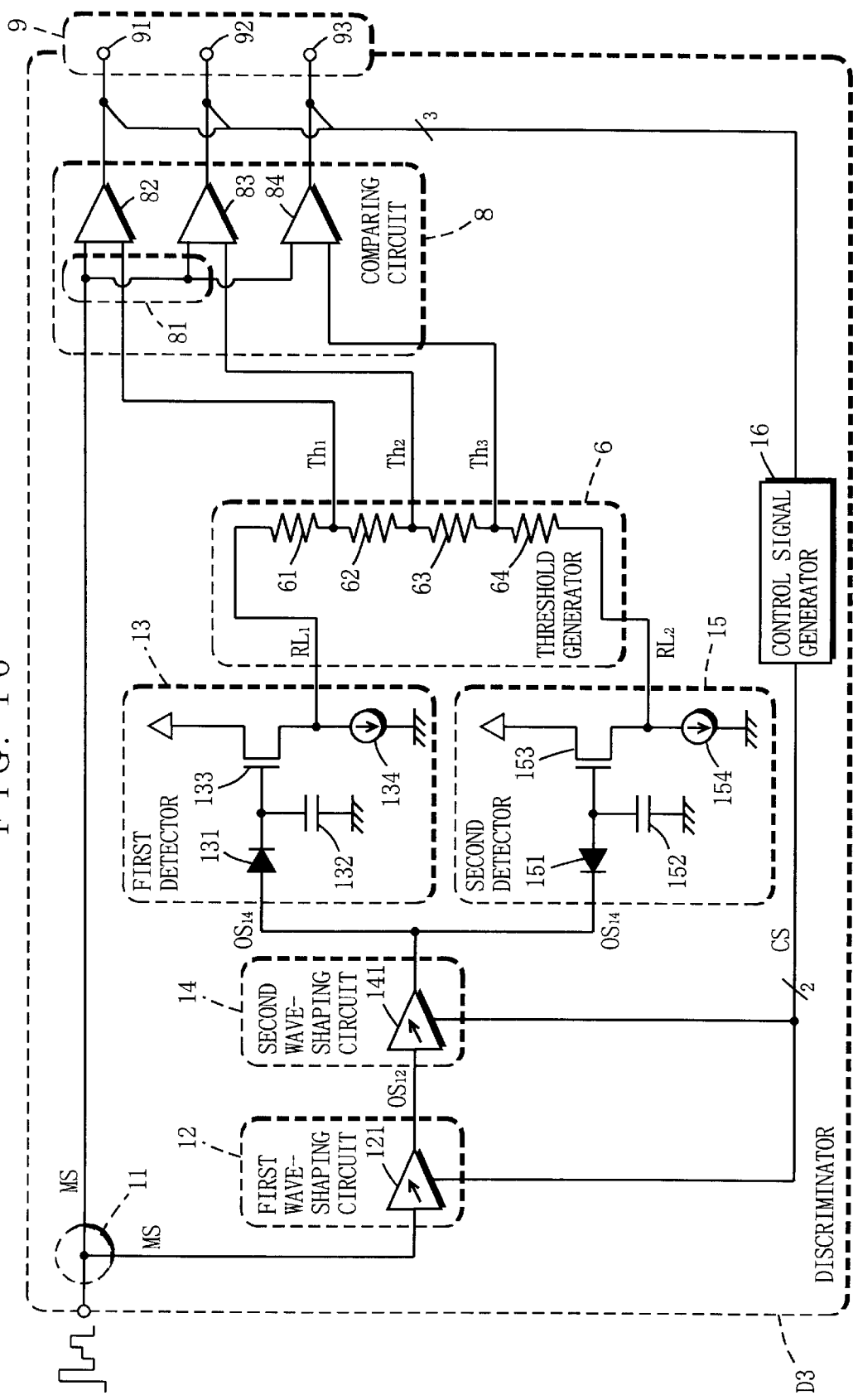
FIG. 10 is a circuit diagram showing the entire configuration of a discriminator D3 according to the third embodiment.

Described next is a discriminator D3 according to a third embodiment of the present invention. FIG. 10 shows a detailed circuit structure of the discriminator D3. The discriminator D3 has a similar structure to that of the discriminator D2 (refer to FIG. 6). Therefore, components corresponding to those of FIG. 6 are provided with the same reference numerals in FIG. 10.

However, the discriminator D3 clearly differs the discriminator D2 in that the first and second wave-shaping circuits 12 and 14 are connected in series. This difference is mainly described below.

The first branching part 11 branches the multi-level signal MS inputted through the input terminal 1 (refer to FIG. 7a) into two, one outputted to the first wave-shaping circuit 12 and the other outputted to the comparing circuit 8.

The first wave-shaping circuit 12 includes the first amplifier 121. The input terminal of the first amplifier 121 is coupled to the first branching part 11, while its output terminal is coupled to the input terminal of the second amplifier 141. The first amplifier 121 is further coupled to the control signal generator 16.

The amplification factor $A_{121}$ of the first amplifier 121 is set to different values according the first to fourth control signals $CS_1$ to $CS_4$ (refer to FIG. 8), similarly to the second embodiment. The amplification factor $A_{121}$ is determined according to the format of the multi-level signal MS and/or the specifications of the discriminator D3. Described below is an example of the amplification factor $A_{121}$.

When the first amplifier 121 receives the first control signal $CS_1$, the amplification factor $A_{121}$ is set to W/X relative to the base level of the multi-level signal MS (the amplitude value "Z"). In the third embodiment, W/X is 1.5. On the other hand, when the first amplifier 121 receives the second or fourth control signal $CS_2$ or $CS_4$, the amplification factor $A_{121}$ is set to 1.

With the above structure, when the multi-level signal MS of FIG. 7a is inputted to the discriminator D3, the second control signal $CS_2$ is sent to the first amplifier 121 during the time intervals $T_7$ and $T_9$, thereby setting the amplification factor $A_{121}$ to 1. Therefore, the first amplifier 121 directly outputs the multi-level signal MS from the first branching part 11 to the input terminal of the second amplifier 141.

During the time interval $T_8$, the first control signal $CS_1$ is sent to the first amplifier 121, thereby setting the amplification factor $A_{121}$ to 1.5. Therefore, the first amplifier 121 amplifies the amplitude of the received multi-levels signal MS by 1.5 times relative to the base level. Consequently, since the amplitude of the multi-level signal MS is amplified by 1.5 times during the time interval $T_8$, the waveform of the output signal $OS_{12}$ becomes as such shown in FIG. 7b, with its peak value during the time interval $T_8$ substantially equal in electric potential to the amplitude value "W".

In FIG. 10, the second wave-shaping circuit 14 includes the second amplifier 141. The input terminal of the second amplifier 141 is coupled to the first amplifier 121, while its output terminal is coupled to the anode of the first diode 131 and the cathode of the second diode 151. The second amplifier 141 is further coupled to the control signal generator 16.

The amplification factor $A_{141}$ of the second amplifier 141 takes different values according to the first to fourth control signals $CS_1$ to $CS_4$ as described above. The amplification factor $A_{141}$ is predetermined according to the format of the multi-level signal MS and/or the specifications of the discriminator D3. Described below is an example of the amplification factor $A_{141}$.

When the second amplifier 141 receives the first control signal $CS_1$, the amplification factor $A_{141}$ is set to $|W-Z|/|W-3.Y/2|$ relative to the amplitude value "W" of the multi-level signal MS. In the third embodiment, $|W-Z|/|W-3/.Y/2|$ is 2. On the other hand, when the second amplifier 141 receives the second or third control signal $CS_2$ or $CS_3$, the amplification factor $A_{141}$ is set to 1.

Described next is one specific embodiment of the operation of the second wave-shaping circuit 14 having the above described structure. With the signal of FIG. 7b inputted to the second amplifier 141, the second control signal $CS_2$ is sent to the second amplifier 141 during the time intervals $T_7$ and $T_9$, thereby setting the amplification factor $A_{141}$ to 1. Therefore, the second amplifier 141 directly inputs the received signal to the first and second diodes 131 and 151.

During the time interval $T_8$, the first control signal $CS_1$ is sent to the second amplifier 141, thereby setting the amplification factor $A_{141}$ to 2. therefore, the second amplifier 141 amplifies the amplitude of the received signal twice relative to the amplitude value "W", and outputs the signal $OS_{14}$ to the first and second diodes 131 and 151.

As such, the second wave-shaping circuit 14 shapes the waveform of the signal outputted from the first wave-shaping circuit 12. Consequently, since the amplitude of the received signal $OS_{12}$ (refer to FIG. 7b) is amplified twice during the time interval $T_8$ relative to the amplitude value "W", the waveform of the output signal $OS_{14}$ becomes as such shown in FIG. 11, with its bottom value during the time interval $T_8$ substantially equal in electric potential to the amplitude value "Z".

Figure 11:
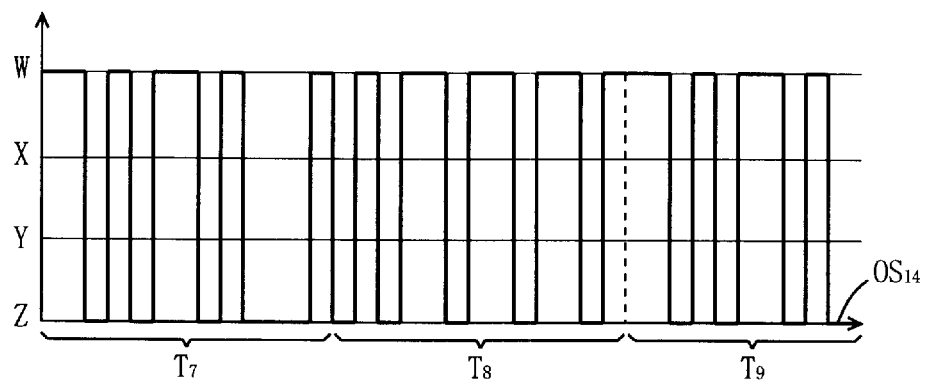
FIG. 11 is a diagram showing a waveform of an output signal $OS_{14}$ according to the third embodiment.

Provided with the signal $OS_{14}$ of FIG. 11, the first and second detectors 13 and 15 can detect constant peak and bottom values, as similarly to the second embodiment. Therefore, as similar to the discriminator D1, the discriminator D3 can correctly discriminate the amplitude of even the multi-level signal MS in which one or more specific amplitude values are excessively distributed during a certain time interval (refer to FIG. 7a) This amplitude discrimination enables generation of the multi-level signal MS in the transmitting side with less restrictions than ever.

Note that the discriminators D2 and D3 do not include the component corresponding to the amplitude adjuster 7 of the discriminator D1. Even without such component, the threshold generator 6 can generate the thresholds $Th_1$, $Th_2$, and $Th_3$ that allow correct amplitude discrimination without pulse-width distortion because the first and second reference levels $RL_1$ and $RL_2$ are selected to be the amplitude values "W" and "Z", respectively.

However, the amplitude adjuster 7 may be required also in the discriminators D2 and D3 depending on the values selected for the first and second reference levels $RL_1$ and $RL_2$. For example, in the discriminator D2, the amplitude adjuster 7 capable of dividing the voltage of an input signal into two-thirds is required to be placed between the first branching part 11 and the comparing circuit 8 when the amplitude values "X" and "Z" are selected for the first and second reference levels $RL_1$ and $RL_2$, respectively.

Note that the amplitude adjuster 7 may be placed between the first branching part 11 and the first and second wave-shaping circuits 12 and 14, between the threshold generator 6 and the comparing circuit 8, or the like. Further, two or more amplitude adjusters 7 may be provided.

Further, in the second and third embodiments, the first or second detector 13 or 15 may be a circuit of detecting an average value of the signal outputted from the first or second wave-shaping circuit 12 or 14 (refer to FIG. 4a).

Still further, in each of the second and third embodiments, the first and second detectors 13 and 15 preferably operates within the minimum pulse width of the multi-level signal, as the detector 4 in the first embodiment.

Still further, in the first to third embodiments, when a multi-level signal MS in which an unnecessary amplitude is excessively distributed is sent to the discriminators D1 to D3. immediately after startup, the detector comprising a diode (or resistor) and a capacitor cannot, in some cases, detect the first or second reference level $RL_1$ or $RL_2$ quickly. For example, when a multi-level signal MS in which the amplitude values "Y" and "Z" are excessively distributed is sent to the discriminator D1 of FIG. 2 immediately after startup, the detector 4 consumes much time in detecting the first reference level $RL_1$ (amplitude value "X"), making it impossible for the threshold generator 6 to generate the thresholds $Th_1$, $Th_2$, and $Th_3$ quickly and correctly.

For correct amplitude discrimination by the discriminator D1 from immediately after startup, it is preferred that an initial value generator for generating an initial value of the first reference level $RL_1$ be placed in the detector 4. The initial value generator operates only in a predetermined time interval after startup of the discriminator D1 to input the generated initial value of the first reference level $RL_1$ to the threshold generator 6. The initial value generator enables the threshold generator 6 to quickly and correctly generate the thresholds $Th_1$, $Th_2$, and $Th_3$ immediately after startup of the discriminator D1.

This initial value generator can also be placed in the first or second detector 13 or 15.

Still further, an initial value generator for generating initial values of the thresholds $Th_1$, $Th_2$, and $Th_3$ may be placed in the threshold generator 6 for correct amplitude discrimination by the discriminators D1 to D3 immediately after startup. Such initial value generator operates only in a predetermined time interval after startup of the discriminators D1 to D3 to input the generated initial values of the thresholds $Th_1$, $Th_2$, and $Th_3$ to the comparators 82, 83, and 84, respectively.

Still further, prior to the multi-level signal MS, a training signal may be transmitted from the transmitting side to the discriminators D1 to D3 in a predetermined time interval for the above mentioned correct amplitude discrimination. Such training signal has a predetermined amplitude or pattern. For example, if a training signal having the amplitude value "X" is sent to the discriminator D1 at least during a time interval of charging the capacitor 42, the detector 4 can correctly detect the first reference level $RL_1$ from the head of the multi-level signal MS.

Still further, in the above described embodiments, the multi-level signal MS has four amplitude values. However, the number of amplitude values is not limited to four, and the technical idea of the discriminators D1 to D3 can be easily applied to circuits capable of discriminating the amplitude of a multi-level signal MS having n amplitude values. In the discriminators D1 to D3, the point is that the first reference level $RL_1$ and/or the second reference level $RL_2$ has a predetermined constant electric potential. Therefore, without depending on the number of amplitude values in the multi-level signal MS, the wave-shaping circuit 3, the first wave-shaping circuit 12, or the second wave-shaping circuit 14 shapes the waveform of the multi-level signal MS so that its part in which one or more specific amplitude values are excessively distributed becomes equal in electric potential to the first reference level $RL_1$ and/or the second reference level $RL_2$.

While the invention has been described in detail, the foregoing description is in all aspects illustrative and not restrictive. It is understood that numerous other modifications and variations can be devised without departing from the scope of the invention.

What is claimed is:

1. A discriminator discriminating a multi-level signal varying in amplitude among three or more values, comprising:

a first branching part branching the multi-level signal externally inputted thereto into two;

a wave-shaping circuit shaping a waveform of the multi-level signal branched by said first branching part under a predetermined condition;

a detector detecting a first reference level based on an output signal from said wave-shaping circuit;

a reference level generator generating a second reference level of the multi-level signal externally inputted;

a threshold generator generating a required number of thresholds according to said first and second reference levels;

a comparing circuit comparing the amplitude of the multi-level signal branched by said first branching part with the thresholds generated by said threshold generator; and a control signal generator generating a control signal according to a comparison result by said comparing circuit, said wave-shaping circuit shaping the waveform of the multi-level signal inputted thereto according to the control signal outputted from said control signal generator so that said detector can correctly detect the first reference level.

2. A discriminator according to claim 1, wherein said threshold generator generates (the number of amplitude values–1) different thresholds according to the first and second reference levels, said comparing circuit comprises:
  a second branching part branching the multi-level signal inputted thereto into (the number of amplitude values–1); and
  (the number of amplitude values–1) comparators each receiving different one of the thresholds generated by said threshold generator and the multi-level signal branched by said second branching part, and
  each of said comparators compares the amplitude of the received multi-level signal with the received threshold.

3. The discriminator according to claim 1, further comprising:
  an amplitude adjuster adjusting a relative difference between the amplitude of the multi-level signal branched by said first branching part and each of the thresholds generated by said threshold generator.

4. The discriminator according to claim 1, wherein
said reference level generator generates the second reference level having an electric potential when the multi-level signal is not sent.

5. The discriminator according to claim 1, wherein
said control signal defines a time interval during which one or more predetermined amplitude values are excessively distributed in the multi-level signal, and
said wave-shaping circuit shapes the waveform of the multi-level signal inputted thereto so that one of the predetermined amplitude values becomes equal to the second reference level during the time interval defined by the control signal.

6. A discriminator discriminating a multi-level signal varying in amplitude among three or more values, comprising:
  a first branching part branching the multi-level signal externally inputted thereto into three and outputting first to third multi-level signals;
  a first wave-shaping circuit shaping a waveform of the first multi-level signal outputted from said first branching part under a predetermined condition;
  a first detector detecting a first reference level from an output signal from said first wave-shaping circuit;
  a second wave-shaping circuit shaping a waveform of the second multi-level signal outputted from said first branching part under a predetermined condition;
  a second detector detecting a second reference level from a signal outputted from said second wave-shaping circuit;
  a threshold generator generating a required number of thresholds according to said first and second reference levels;
  a comparing circuit comparing the amplitude of the third multi-level signal outputted from said first branching part with the thresholds generated by said threshold generator; and
  a control signal generator generating a control signal according to a comparison result by said comparing circuit,
  said first wave-shaping circuit shaping the waveform of the first multi-level signal inputted thereto according to the control signal outputted from said control signal generator so that said first detector can correctly detect the first reference level, and
  said second wave-shaping circuit shaping the waveform of the second multi-level signal inputted thereto according to the control signal outputted from said control signal generator so that said second detector can correctly detect the second reference level.

7. The discriminator according to claim 6, wherein
said threshold generator generates (the number of amplitude values–1) different thresholds according to the first and second reference levels,
said comparing circuit comprises:
  a second branching part branching the third multi-level signal inputted thereto into (the number of amplitude values–1); and
  (the number of amplitude values–1) comparators each receiving different one of the thresholds generated by said threshold generator and the third multi-level signal branched by said second branching part, and
  each of said comparators compares the amplitude of the received third multi-level signal with the received threshold.

8. The discriminator according to claim 6, further comprising:
  an amplitude adjuster adjusting a relative difference between the amplitude of the third multi-level signal inputted to said comparing circuit and the each of thresholds generated by said threshold generator.

9. The discriminator according to claim 6, wherein
said control signal defines a time interval during which one or more predetermined amplitude values are excessively distributed in the multi-level signal, and
said first and second wave-shaping circuits shape the waveforms of the first and second multi-level signals inputted thereto so that one of the predetermined amplitude values becomes equal to said first and second reference levels, respectively, during the time interval defined by the control signal.

10. A discriminator discriminating a multi-level signal varying in amplitude among three or more values, comprising:
  a first branching part branching the multi-level signal externally inputted into two;
  a first wave-shaping circuit shaping a waveform of the multi-level signal outputted from said first branching part under a predetermined condition;
  a second wave-shaping circuit shaping a waveform of an output signal from said first wave-shaping circuit under a predetermined condition;
  a first detector detecting a first reference level based on an output signal from said second wave-shaping circuit;
  a second detector detecting a second reference level based on the output signal from said second wave-shaping circuit;
  a threshold generator generating a required number of thresholds according to said first and second reference levels,
  a comparing circuit comparing the amplitude of the multi-level signal branched by said first branching part with the thresholds generated by said threshold generator; and
  a control signal generator generating a control signal according to a comparison result by said comparing circuit,
  said first wave-shaping circuit shaping the waveform of the multi-level signal inputted thereto according to the control signal outputted from said control signal generator so that said first detector can correctly detect the first reference level, and said second wave-shaping circuit shaping the waveform of the output signal from said first wave-shaping circuit according to the control signal outputted from said control signal generator so that said second detector can correctly detect the second reference level.

11. The discriminator according to claim 10, wherein said threshold generator generates (the number of amplitude values−1) different thresholds according to the first and second reference levels, said comparing circuit comprises:

a second branching part branching the multi-level signal inputted thereto into (the number of amplitude values−1); and (the number of amplitude values−1) comparators each receiving different one of the thresholds generated by said threshold generator and the multi-level signal branched by said second branching part, and each of said comparators compares the amplitude of the received multi-level signal with the received threshold.

12. The discriminator according to claim 10, further comprising:

an amplitude adjuster adjusting a relative difference between the amplitude of the multi-level signal branched by said first branching part and the thresholds generated by said threshold generator.

13. The discriminator according to claim 10, wherein said control signal defines a time interval during which one or more predetermined amplitude values are excessively distributed in the multi-level signal, and said first and second wave-shaping circuits shape the waveform of the respective received signal so that one of the predetermined amplitude values becomes equal to the first and second reference levels, respectively, during the time interval defined by the control signal.

* * * * *